(12) United States Patent
Ker et al.

(10) Patent No.: US 7,579,658 B2
(45) Date of Patent: Aug. 25, 2009

(54) DEVICES WITHOUT CURRENT CROWDING EFFECT AT THE FINGER'S ENDS

(75) Inventors: Ming-Dou Ker, Hsinchu (TW); Geeng-Lih Lin, Hsinchu Hsien (TW); Hsin-Chyh Hsu, Taoyuan (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 39 days.

(21) Appl. No.: 11/711,668

(22) Filed: Feb. 28, 2007

(65) Prior Publication Data

US 2007/0145418 A1     Jun. 28, 2007

Related U.S. Application Data

(62) Division of application No. 10/600,524, filed on Jun. 23, 2003, now abandoned.

(30) Foreign Application Priority Data

Sep. 18, 2002  (TW) ............................... 91121370 A

(51) Int. Cl.
  *H01L 23/62*  (2006.01)
(52) U.S. Cl. .................. 257/356; 257/355; 257/360; 257/361; 257/362; 257/E27.063; 257/E29.015; 257/E29.063; 257/E29.281; 361/56; 361/57

(58) Field of Classification Search .................. 257/355, 257/356, 360, 361, 362, E27.063, E29.015, 257/E29.063, E29.281; 361/56, 57
See application file for complete search history.

(56) References Cited

U.S. PATENT DOCUMENTS

| | | | |
|---|---|---|---|
| 6,246,080 B1 * | 6/2001 | Takahashi et al. ........... | 257/288 |
| 6,587,320 B1 * | 7/2003 | Russ et al. .................... | 361/56 |
| 6,621,133 B1 * | 9/2003 | Chen et al. .................. | 257/409 |
| 6,864,536 B2 * | 3/2005 | Lin et al. ..................... | 257/355 |
| 2002/0175377 A1 * | 11/2002 | Lin ............................. | 257/355 |
| 2003/0230780 A1 * | 12/2003 | Cai et al. ..................... | 257/355 |

* cited by examiner

*Primary Examiner*—Ngan Ngo
*Assistant Examiner*—Benjamin Tzu-Hung Liu
(74) *Attorney, Agent, or Firm*—Birch, Stewart, Kolasch & Birch, LLP

(57) ABSTRACT

ESD protection devices without current crowding effect at the finger's ends. It is applied under MM ESD stress in sub-quarter-micron CMOS technology. The ESD discharging current path in the NMOS or PMOS device structure is changed by the proposed new structures, therefore the MM ESD level of the NMOS and PMOS can be significantly improved. In this invention, 6 kinds of new structures are provided. The current crowding problem can be successfully solved, and have a higher MM ESD robustness. Moreover, these novel devices will not degrade the HBM ESD level and are widely used in ESD protection circuits.

8 Claims, 14 Drawing Sheets

US 7,579,658 B2

DEVICES WITHOUT CURRENT CROWDING EFFECT AT THE FINGER'S ENDS

CROSS-REFERENCE TO RELATED APPLICATIONS

This application is a divisional application of U.S. Utility application Ser. No. 10/600,524, filed Jun. 23, 2003, now abandoned which is hereby incorporated herein in its entirety by reference.

BACKGROUND OF THE INVENTION

1. Field of the Invention

The present invention relates to an ESD protection device and particularly to an ESD protection device eliminating ESD current crowding events, so that a higher ESD level may be achieved under MM ESD testing.

2. Description of the Prior Art

ESD damage has become one of the main reliability concerns facing IC (integrated circuit) products. Particularly, when scaled down to the deep sub-micron regime and the thinner gate oxide, the MOS become more vulnerable to ESD stress. For general industrial specifications, the input and output pins of IC products must sustain HBM (Human-Body-Model) ESD stress of over 2000V and MM (Machine-Model) ESD stress of over 200V. Therefore, ESD protection circuits must be placed around the input and output (I/O) pads of the IC to protect IC against the ESD stress.

ESD protection devices are frequently drawn with large device dimensions and realized by finger-type layout to save total layout area. The layout top views and cross-sectional views of the prior arts to improve the ESD level of ESD protection devices by layout method are shown in FIGS. 1A and 1B. It is formed on a P silicon substrate 11 and includes a STI (shallow trench isolation) 13 enclosing an active region 12, a P guard ring 14 enclosing the STI 13, two gates 15, each composed of polysilicon layer 151, gate oxide 152 and spacers 153, and N drain and source region 161 and 162 placed in between and on the outer sides of the gates 15. The gates, source region, and body are typically connected to the ground while the drain region is connected to the input/output pad. The fundamental theorem of ESD protection design is based on the mechanisms of the MOS and the parasitic lateral n-p-n bipolar (BJT) under high current, and high field conduction. FIGS. 2A and 2B are sectional views and an equivalent circuit of a NMOS transistor, with the drain 22 as the collector, substrate 21 as the body and source 23 as the emitter. During ESD stress, high field at the drain causes the N+ to P substrate junction to enter an avalanche breakdown condition, generating excessive electron-hole pairs. The current of the electron-hole pairs forward biases the substrate-source (PN junction), and the voltage drop across the substrate resistances increase the BE junction voltage of the parasitic BJT which is triggered to generate the snapback region in its I-V curves, as shown in FIG. 3. Thus, the parasitic BJT turns on to and bypass the ESD current.

FIGS. 4A and 4B are top and sectional views of another conventional ESD protection device, a gate grounded NMOS. With comparison to the ESD protection device in FIGS. 1A and 1B, it is noted that the bulk substrate resistance of the BB' region is much larger than that of the AA' region. This allows the parasitic BJT of the BB' region to turn on faster than that of the AA' region with higher collector current to bypass the ESD current and spread through the BB' region. The parasitic BJT of the BB' region can provide larger effective area than the AA' region to discharge the ESD current, therefore it may have a high HBM ESD robustness. However, under MM ESD zapping, the drain node conductivity with higher peak currents of 3~4 Amps (for 200V MM ESD stress) often cause ESD damage at the corner or finger's end regions. The cause of damage is MM ESD current 3 or 4 times higher through an extremely small resistance than the HBM ESD current. Although the resistance of the AA' region is smaller than that of the BB' region, the breakdown current (due to ESD zapping at the drain) of the drain to substrate junction at the AA' region is still high enough to forward bias and to turn on the parasitic BJT at the AA' region, before turning on the parasitic BJT at the BB' region. Thus, an excess of current crowds around the AA' region and causes device failure at this region. Such damage is commonly shown in photographic training materials used in ESD protection design training courses.

SUMMARY OF THE INVENTION

The object of the present invention is to provide an ESD protection device eliminating ESD current crowding events to achieve a higher ESD level under MM ESD testing.

The present invention provides a first ESD protection device comprising a substrate, an isolation region on the substrate, enclosing an active region, a first gate having a first and second end overlapping the isolation region to stretch over the active region, and coupled to a first node, a second gate disposed on a first side of the first gate and near the first end of the first gate, and a first and second doping region on the first and a second side of the first gate, and coupled to a second and the first node respectively, wherein the first doping region has a first gap under the second gate.

The present invention provides a second ESD protection device comprising a substrate, an isolation region on the substrate, enclosing an active region, a first gate having a first and second end overlapping the isolation region to stretch over the active region, and coupled to a first node, a second gate disposed on a second side of the first gate and near the first end of the first gate, and a first and second doping region on a first and the second side of the first gate, and coupled to a second and the first node respectively, wherein the second doping region has a first gap under the second gate.

The present invention provides a third ESD protection device comprising a substrate, an isolation region on the substrate, enclosing an active region, a first gate having a first and second end overlapping the isolation region to stretch over the active region, and coupled to a first node, and a first and second doping region on the first and a second side of the first gate, and coupled to a second and the first node respectively, wherein the first doping region has a first gap near the first end of the first gate.

The present invention provides a fourth ESD protection device comprising a substrate, an isolation region on the substrate, enclosing an active region, a first gate having a first and second end overlapping the isolation region to stretch over the active region, and coupled to a first node, and a first and second doping region on the first and a second side of the first gate, and coupled to a second and the first node respectively, wherein the second doping region has a first gap near the first end of the first gate.

The present invention provides a fifth ESD protection device comprising a substrate, an isolation region on the substrate, enclosing an active region, a first gate having a first and second end overlapping the isolation region to stretch over the active region, and coupled to a first node, and a first and second doping region on the first and a second side of the first gate, and coupled to a second and the first node respectively, wherein the isolation region protruding into the first doping region near the first end of the first gate.

The present invention provides a sixth ESD protection device comprising a substrate, an isolation region on the substrate, enclosing an active region, a first gate having a first and second end overlapping the isolation region to stretch over the active region, and coupled to a first node, and a first and second doping region on the first and a second side of the first gate, and coupled to a second and the first node respectively, wherein the isolation region protruding into the second doping region near the first end of the first gate.

The present invention provides a seventh ESD protection device comprising a substrate, an isolation region on the substrate, enclosing an active region, a first gate having a first and second end overlapping the isolation region to stretch over the active region, and coupled to a first node, and a first and second doping region on the first and a second side of the first gate, and coupled to a second and the first node respectively, wherein the isolation region has a first portion under the first end of the first gate protruding into both the first and second doping region.

The present invention provides an eighth ESD protection device comprising a substrate, an isolation region on the substrate, enclosing an active region, a first gate having a first and second end overlapping the isolation region to stretch over the active region, and coupled to a first node, a first and second doping region on the first and a second side of the first gate, and coupled to a second and the first node respectively, and a third doping region disposed under the first and second doping region and near the first end of the first gate, having a doping concentration lower than that of the first and second doping region.

The present invention provides a ninth ESD protection device comprising a substrate, an isolation region on the substrate, enclosing an active region, a first gate having a first and second end overlapping the isolation region to stretch over the active region, and coupled to a first node, a first and second doping region on the first and a second side of the first gate, and coupled to a second and the first node respectively, and a first well disposed under the first doping region and near the first end of the first gate.

The present invention provides a tenth ESD protection device comprising a substrate, an isolation region on the substrate, enclosing an active region, a first gate having a first and second end overlapping the isolation region to stretch over the active region, and coupled to a first node, and a first and second doping region on the first and a second side of the first gate, and coupled to a second and the first node respectively, and wherein the first gate protruding into the first doping region so that, in the first doping region, a width of a center portion is larger than those of portions near the first and second end of the first gate.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

First Embodiment

Figure 1A:
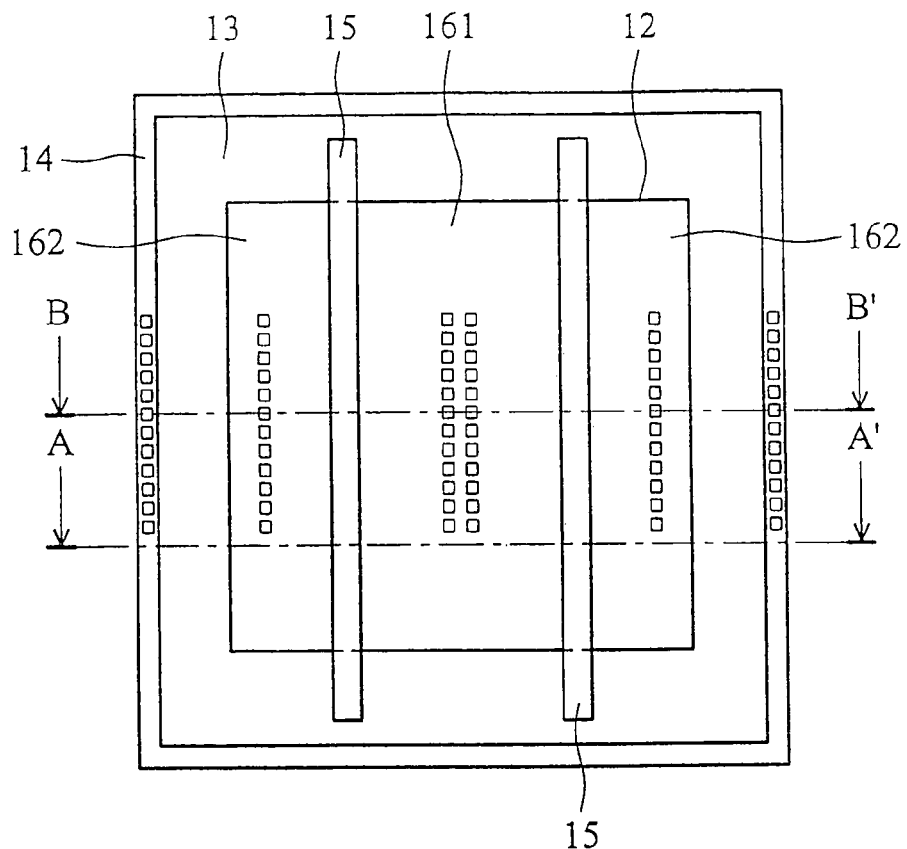
FIGS. 1A and 1B are top and sectional views of a conventional ESD protection device.
Figure 1B:
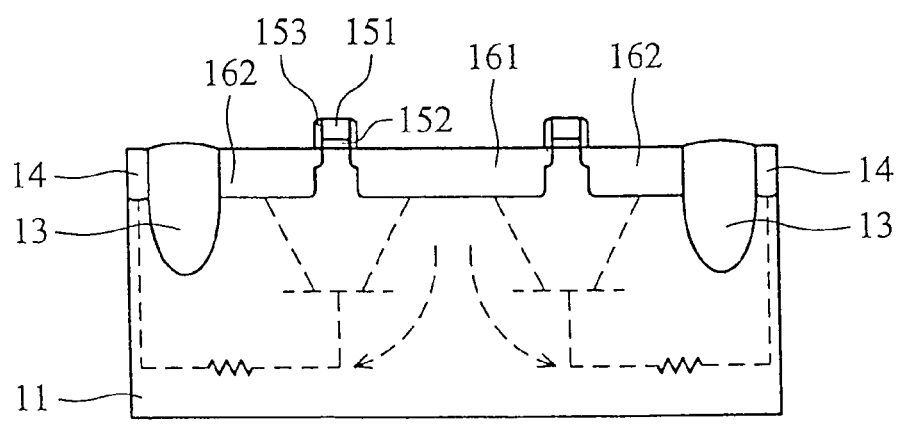
Figure 2A:
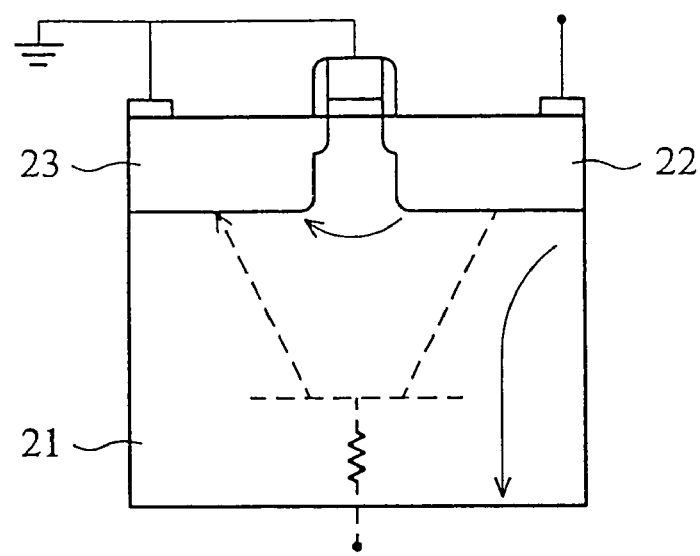
FIGS. 2A and 2B are sectional views and an equivalent circuit of a NMOS transistor.
Figure 2B:
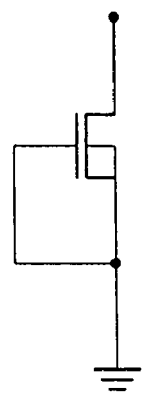
Figure 3:
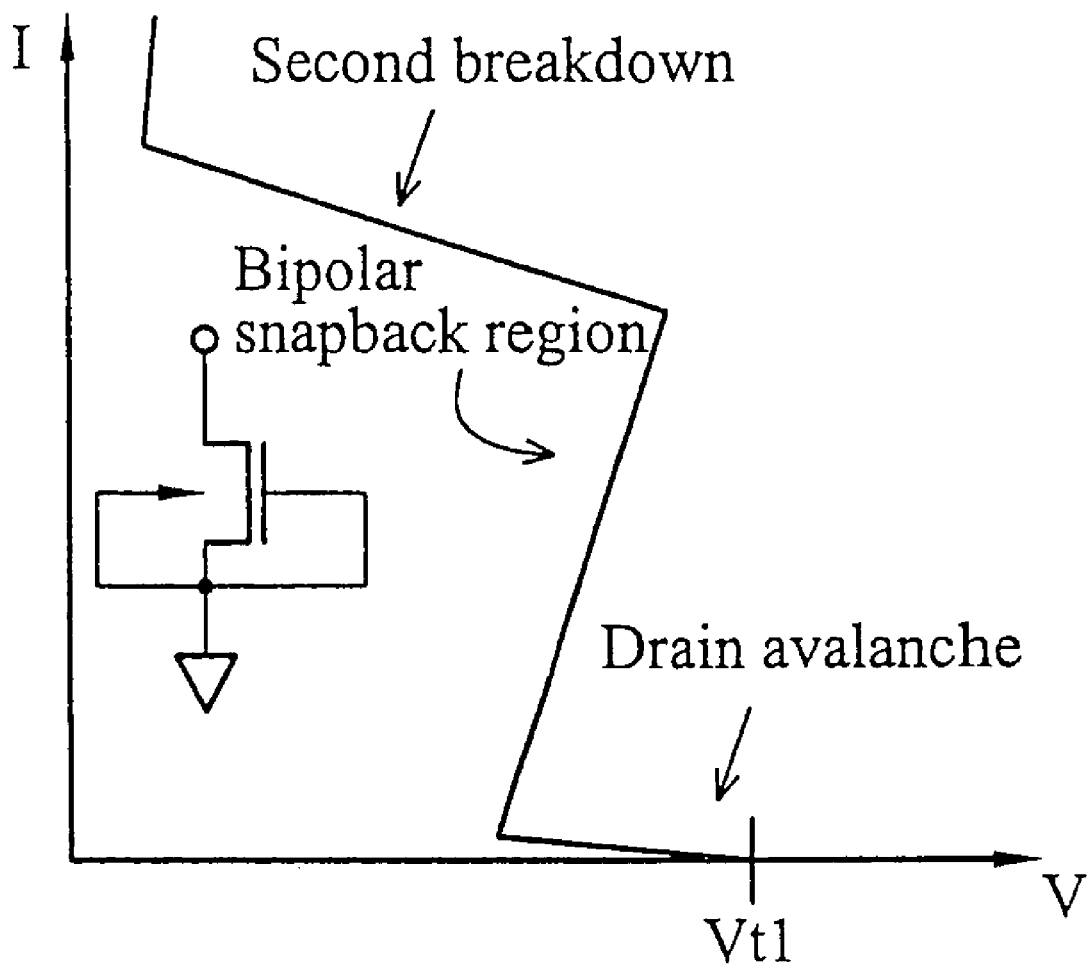
FIG. 3 is a diagram showing a relation between the current and breakdown voltage of a NMOS transistor.
Figure 4A:
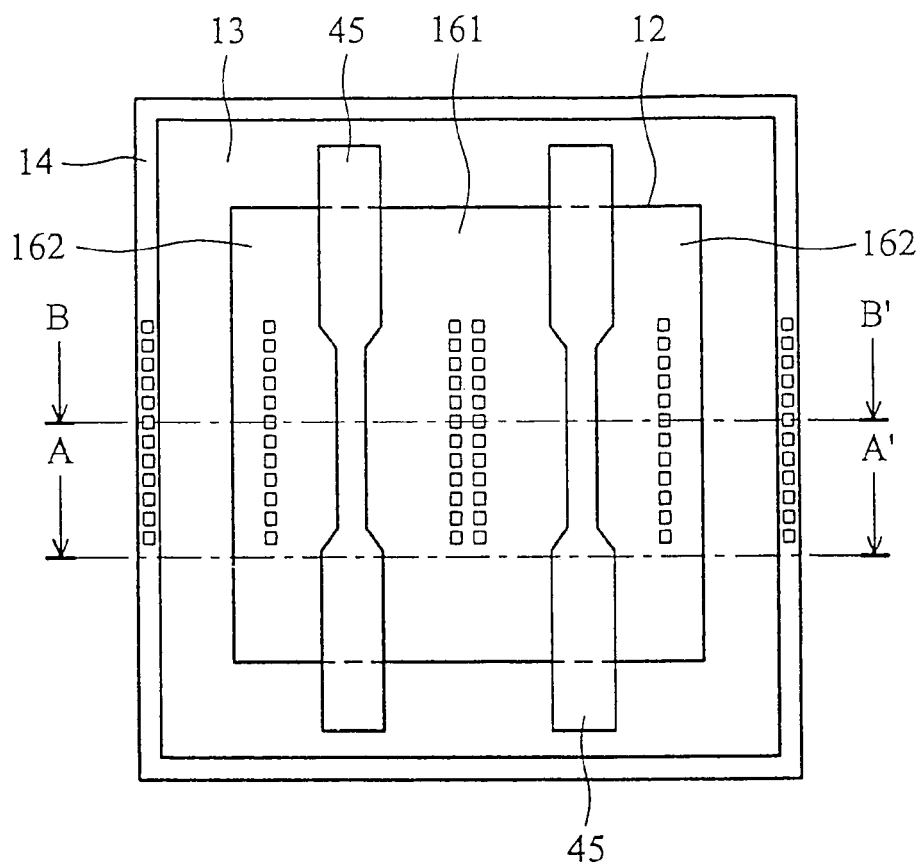
FIGS. 4A and 4B are top and sectional views of another conventional ESD protection device.
Figure 4B:
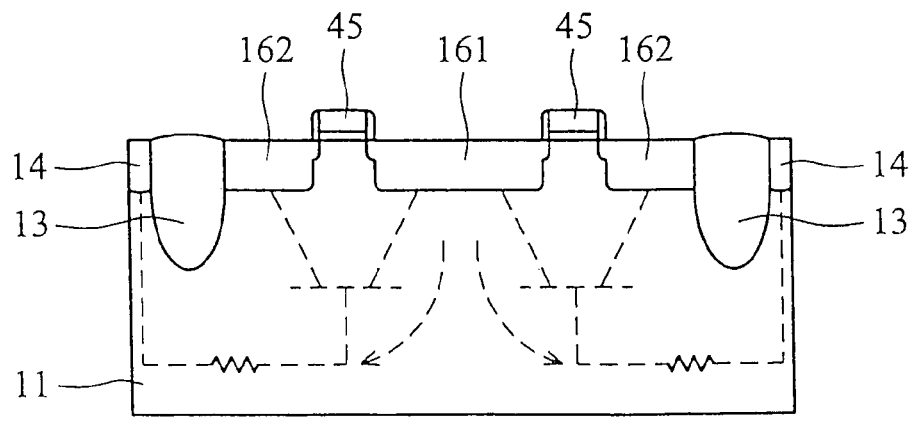
Figure 5A:
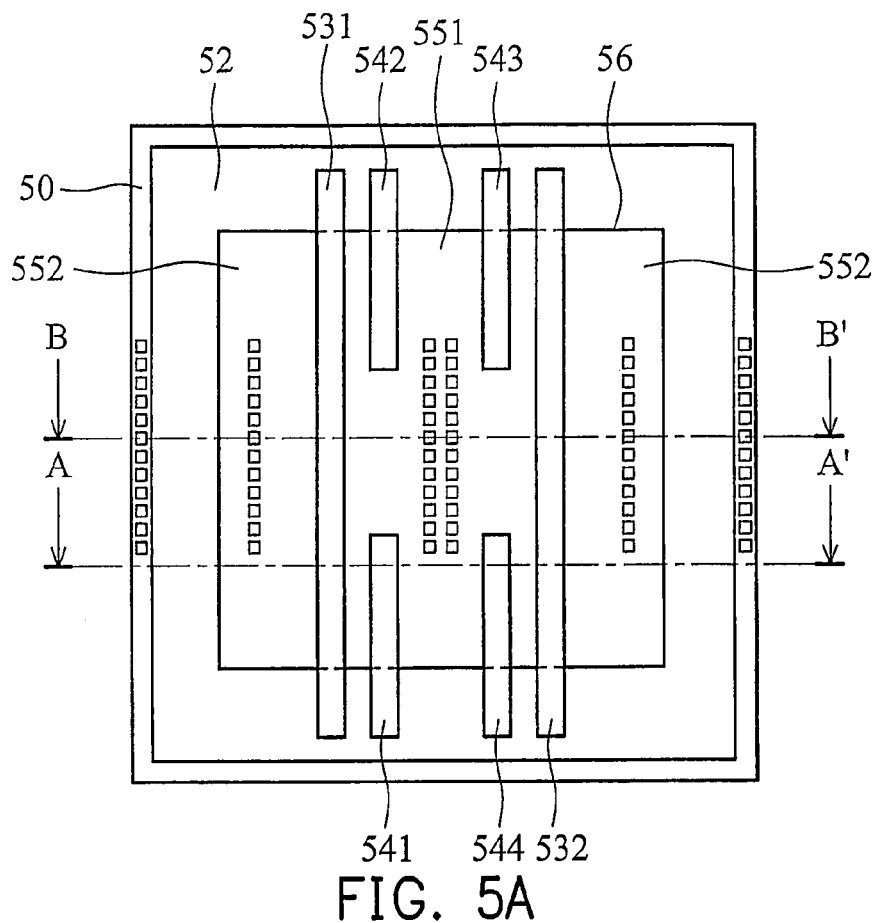
FIGS. 5A and 5B are top and sectional views along a line AA' of an ESD protection device according to a first embodiment of the invention.
Figure 5B:
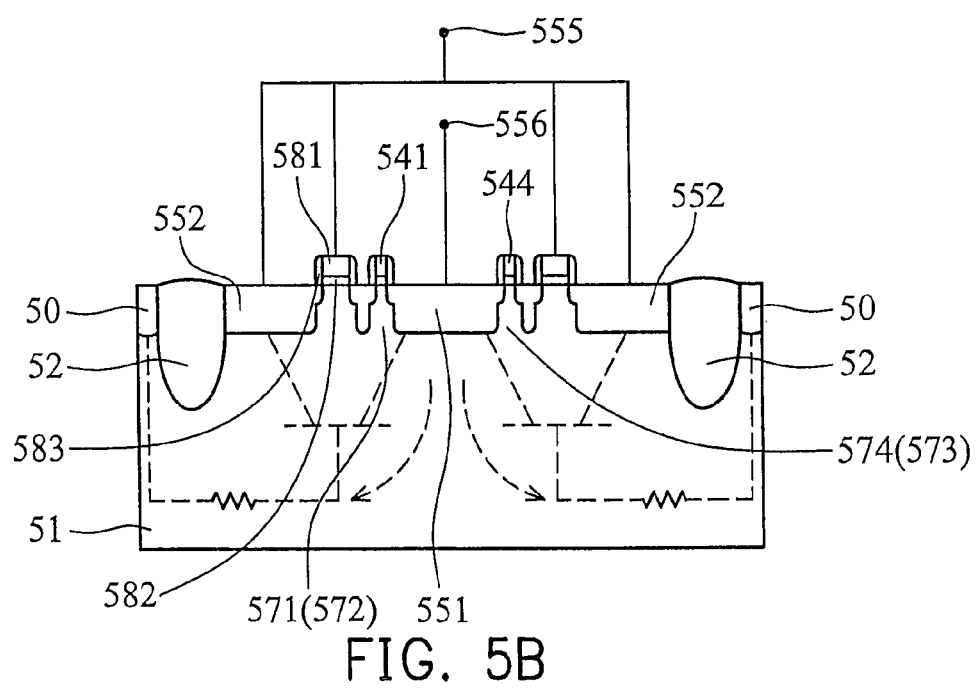

FIGS. 5A and 5B are top and sectional views along a line AA' of an ESD protection device according to a first embodiment of the invention. It includes a P silicon substrate 51, STI (shallow trench isolation) 52, a P guard ring 50 enclosing the STI 52, first gate 531, fourth gate 532, second gate 541, third gate 542, fifth gate 543, sixth gate 544 and N drain and source regions 551 and 552. The STI 52 is on the substrate 51 and encloses an active region 56. The first gate 531 and fourth gate 532 have two ends overlapping the STI 52 to stretch over the active region 56, and are coupled to ground or a pre-driver. The second gate 541, third gate 542, fifth gate 543 and sixth gate 544 are disposed on a common side and near each end of the first gate 531 and fourth gate 532. Each of the second gate 541, third gate 542, fifth gate 543 and sixth gate 544 has one end overlapping the STI 52. The first doping (drain) region 551 and second/third doping (source) region 552 are disposed in between and on outer sides of the first gate 531 and fourth gate 532, and coupled to second node 556 and first node 555, respectively. More specifically, the first node 555 is ground while the second node 556 is a pad. The first doping (drain) region 551 has first discontinuity region 571, second discontinuity region 572, third discontinuity region 573, and fourth discontinuity region 574, with source/drain implantation, in the substrate under the second gate 541, third gate 542, fifth gate 543 and sixth gate 544, respectively. The discontinuity regions 571~574 are formed because the gates 541~544 prevent the substrate under the gates 541~544 from being doped during source/drain formation. Each of the first gate 531, fourth gate 532, second gate 541, third gate 542, fifth gate 543 and sixth gate 544 includes a conducting layer 581 made of polysilicon, an oxide layer 582 made of silicon oxide under the conducting layer 581 and spacers 583 made of silicon oxide adjacent to the conducting layer 581 and oxide layer 582.

In the first embodiment, the base width of the parasitic BJT is directly related to the gate length of the NMOS and the longer channel transistor will have a lower turned-on efficiency because of lower bipolar efficiency. The second gate 541, third gate 542, fifth gate 543 and sixth gate 544 at the AA' region are used to increase the base width of the parasitic BJT at the AA' region and decrease its turned-on efficiency. While the base width of the parasitic BJT at the BB' region is shorter than it is at the AA' region, the turned-on efficiency of the BB' region can be successfully balanced. Therefore, the parasitic BJT at the BB' region will turn on sooner than it will at the AA' region, providing a larger bypass ESD current area than the AA' region and increasing the high MM ESD level. On the other hand, the HBM ESD level will not decrease while second gate 541, third gate 542, fifth gate 543 and sixth gate 544 are inserted into the active region 56 under HBM ESD zapping because the bypass ESD current area is almost the same as the devices of the prior arts.

Second Embodiment

Figure 6A:
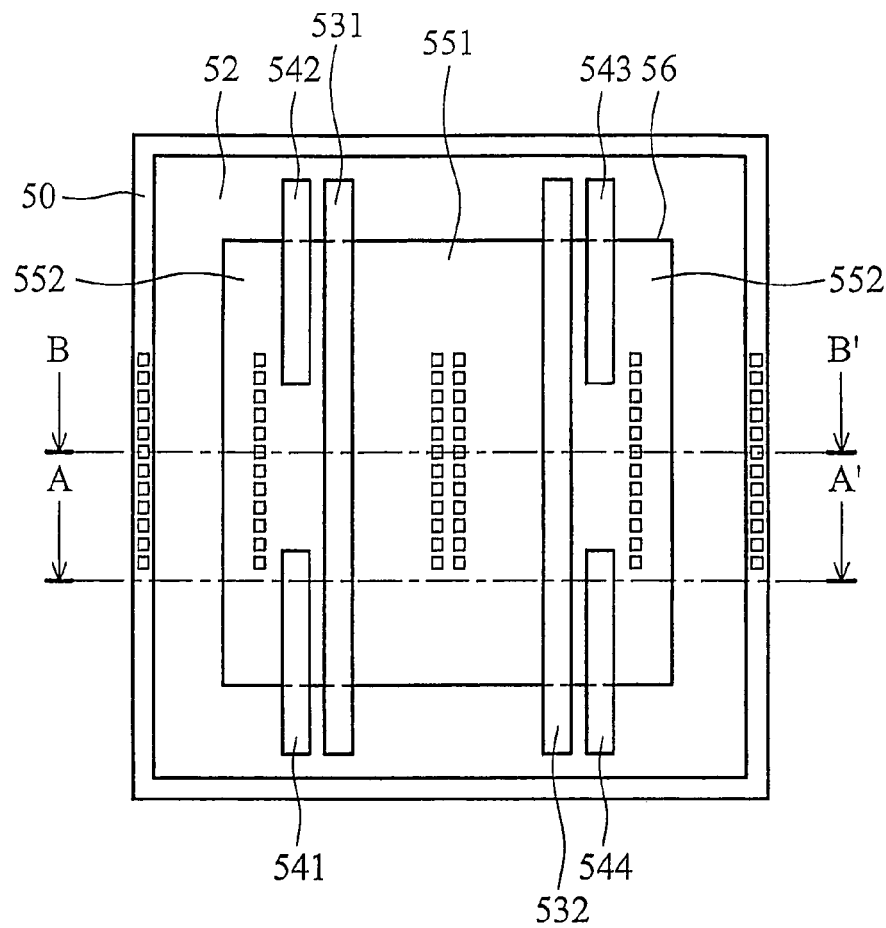
FIGS. 6A and 6B are top and sectional views along a line AA' of an ESD protection device according to a second embodiment of the invention.
Figure 6B:
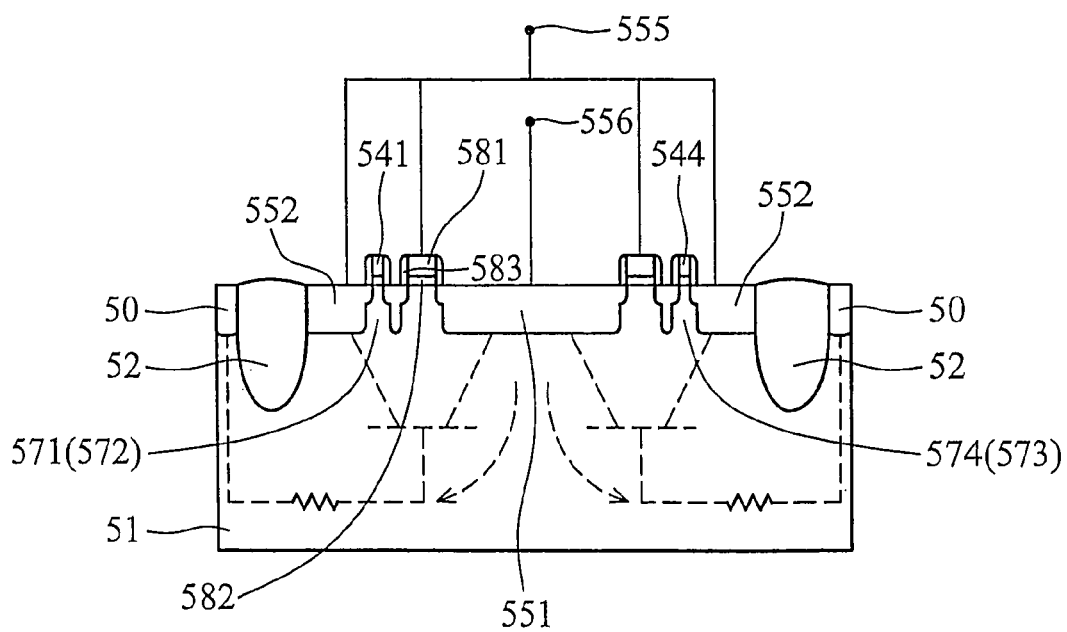

FIGS. 6A and 6B are top and sectional views along a line AA' of an ESD protection device according to a second embodiment of the invention. With comparison to the ESD protection device shown in FIGS. 5A and 5B, it is noted that the second gate 541, third gate 542, fifth gate 543 and sixth gate 544 are disposed on the source region 552 so that the first discontinuity region 571, second discontinuity region 572, third discontinuity region 573, and fourth discontinuity region 574 are located in the source region 552 in the ESD protection device of FIGS. 6A and 6B. The ESD protection devices in FIGS. 5A and 5B, and 6A and 6B have equal ESD performance.

Third Embodiment

Figure 7A:
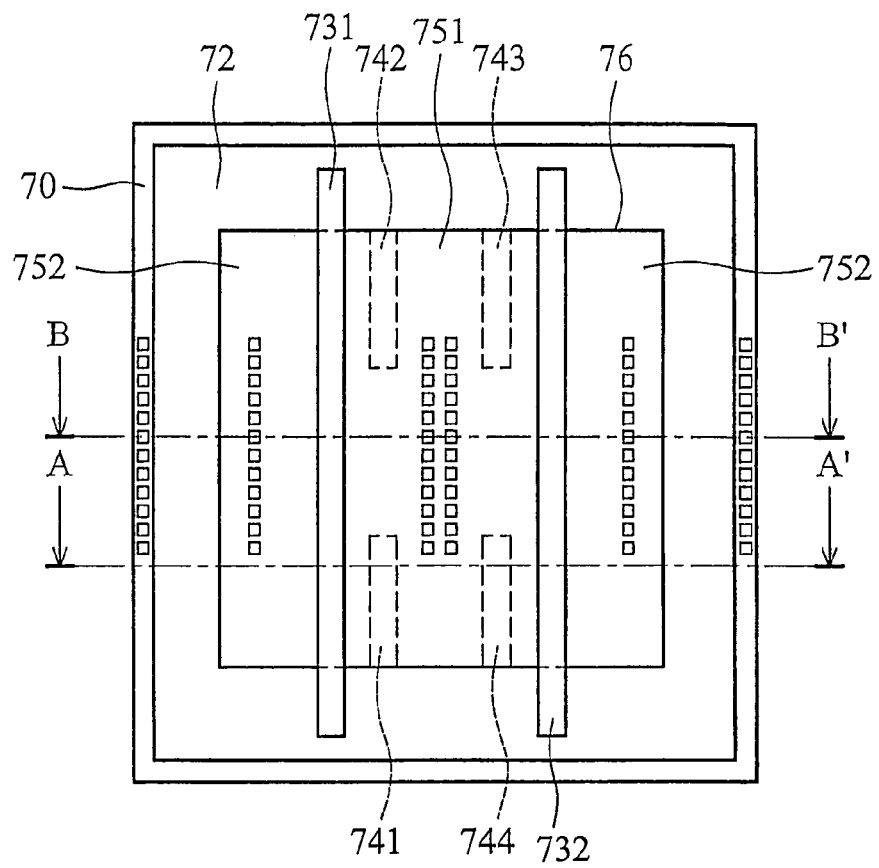
FIGS. 7A and 7B are top and sectional views along a line AA' of an ESD protection device according to a third embodiment of the invention.
Figure 7B:
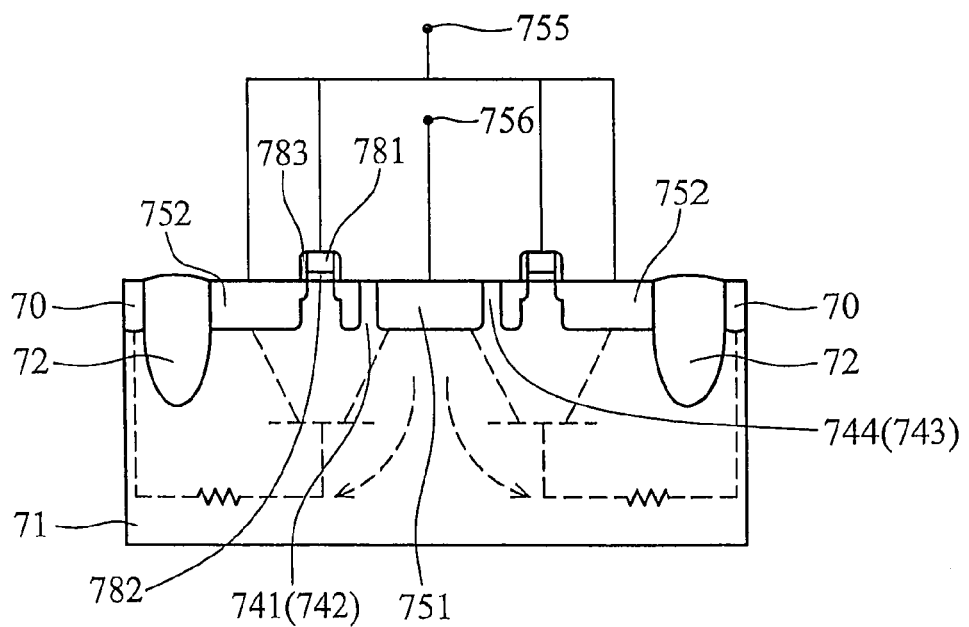

FIGS. 7A and 7B are top and sectional views along a line AA' of an ESD protection device according to a third embodiment of the invention. It includes a P silicon substrate 71, STI (shallow trench isolation) 72, a P guard ring 70 enclosing the STI 72, first gate 731 and second gate 732, and N drain 751 and source region 752. The STI 72 is on the substrate 71 and encloses an active region 76. The first gate 731 and second gate 732 have two ends overlapping the STI 72 to stretch over the active region 76, and are coupled to ground or a pre-driver. The first doping (drain) region 751 and second/third doping (source) region 752 are disposed in between and on outer sides of the first gate 731 and second gate 732, and coupled to second node 756 and first node 755, respectively. More specifically, the first node 755 is ground while the second node 756 is a pad. The first doping (drain) region 751 has first discontinuity region 741, second discontinuity region 742, third discontinuity region 743, and fourth discontinuity region 744 near each end of the first gate 731 and second gate 732. The first discontinuity region 741, second discontinuity region 742, third discontinuity region 743, and fourth discontinuity region 744 are formed by an implantation step compatible with a CMOS process, during which a mask blocks the first discontinuity region 741, second discontinuity region 742, third discontinuity region 743, and fourth discontinuity region 744 from N+ ions. Each of the first gate 731 and second gate 732 includes a conducting layer 781 made of polysilicon, an oxide layer 782 made of silicon oxide under the conducting layer 781 and spacers 783 made of silicon oxide adjacent to the conducting layer 781 and oxide layer 782.

The layout method of the third embodiment, increases the AA' region resistance and decreases parasitic BJT turning on efficiency, making it possible for ESD current to go through the BB' region under MM ESD zapping. Thus, the MM ESD current bypasses bigger areas and has a higher MM ESD level than the device structures of prior arts. On the other hand, the HBM ESD level will not decrease as it has no N+ diffusion between the gates and drain contact at the AA' region. Moreover, the proposed layout method can also be applied to the PMOS to improve its MM ESD robustness.

Fourth Embodiment

Figure 8A:
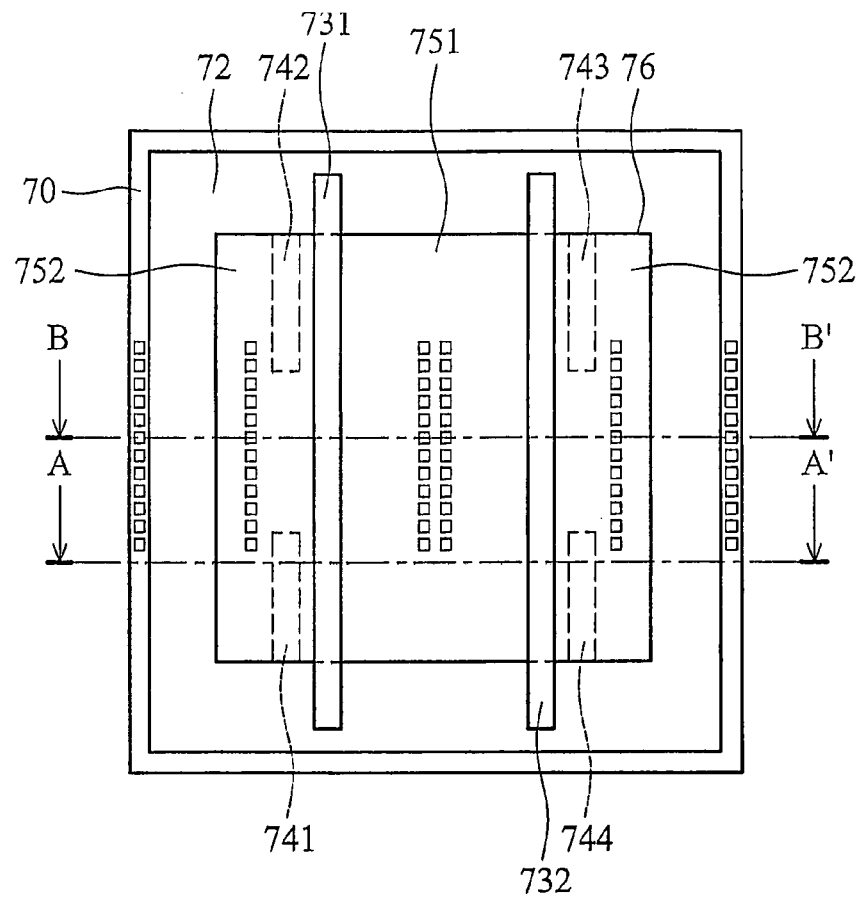
FIGS. 8A and 8B are top and sectional views along a line AA' of an ESD protection device according to a fourth embodiment of the invention.
Figure 8B:
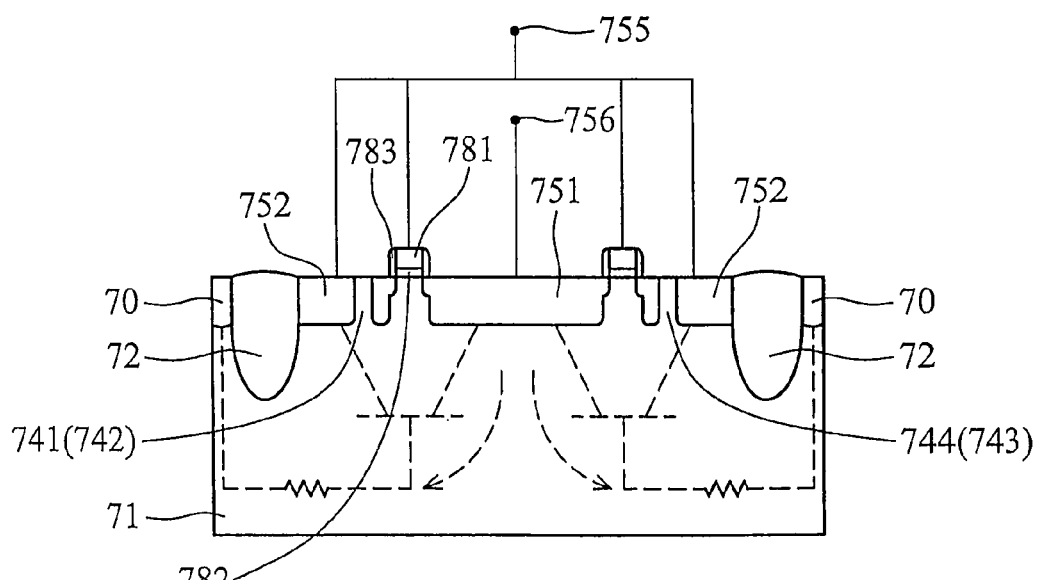

FIGS. 8A and 8B are top and sectional views along a line AA' of an ESD protection device according to a fourth embodiment of the invention. With comparison to the ESD protection device shown in FIGS. 7A and 7B, it is noted that the first discontinuity region 741, second discontinuity region 742, third discontinuity region 743, and fourth discontinuity region 744 are located in the second doping (source) region 752. The ESD protection devices in FIGS. 7A and 7B, and 8A and 8B have equal ESD performance.

Fifth Embodiment

Figure 9A:
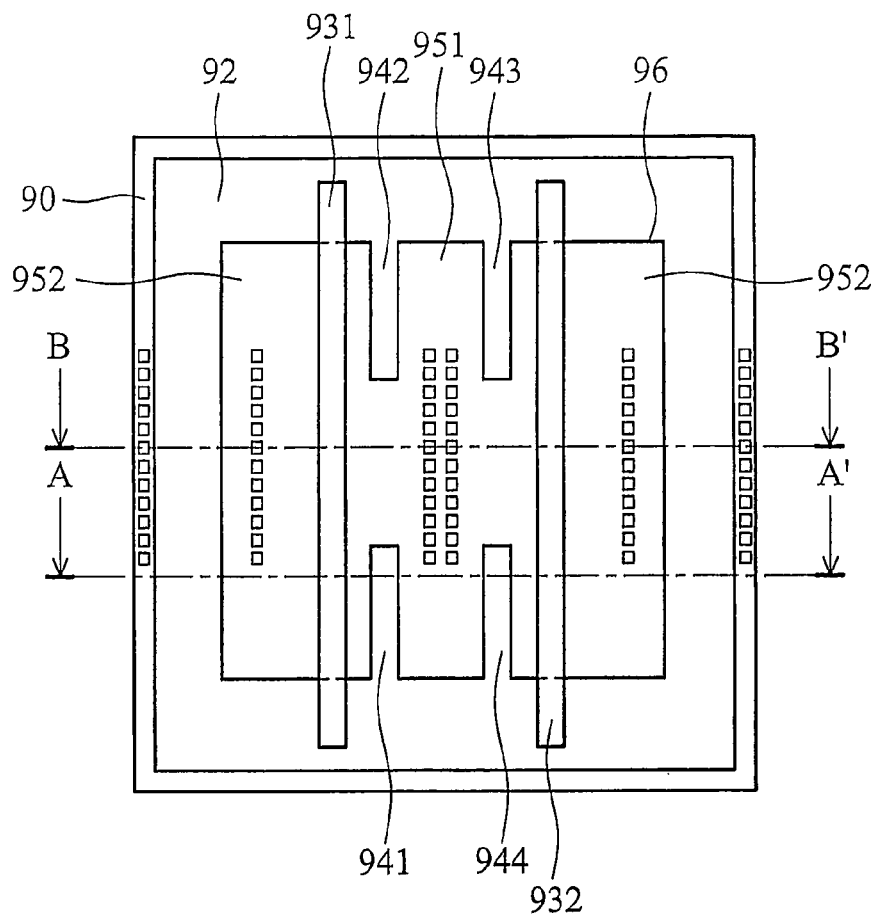
FIGS. 9A and 9B are top and sectional views along a line AA' of an ESD protection device according to a fifth embodiment of the invention.
Figure 9B:
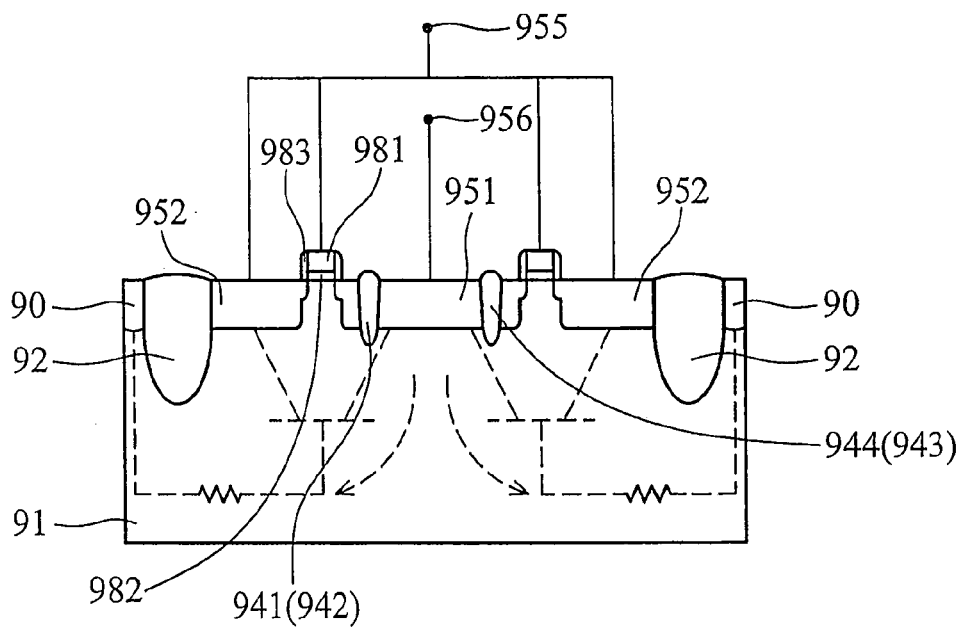

FIGS. 9A and 9B are top and sectional views along a line AA' of an ESD protection device according to a fifth embodiment of the invention. It includes a P silicon substrate 91, STI (shallow trench isolation) 92, a P guard ring 90 enclosing the STI 92, first gate 931 and second gate 932, and N type first doping (drain) region 951 and second doping (source) region 952. The STI 92 is on the substrate 91 and encloses an active region 96. The first gate 931 and second gate 932 have two ends overlapping the STI 92 to stretch over the active region 96, and are coupled to ground or a pre-driver. The first doping (drain) region 951 and second/third doping (source) region 952 are disposed in between and on outer sides of the first gate 931 and second gate 932, and coupled to second node 956 and first node 955, respectively. More specifically, the first node 955 is ground while the second node 956 is a pad. The isolation regions (STI regions) 941~944 protrudes into the first doping (drain) region 951 near first and second ends of the first gate 931 and second gate 932. Each of the first gate 931 and second gate 932 includes a conducting layer 981 made of polysilicon, an oxide layer 982 made of silicon oxide under the conducting layer 981 and spacers 983 made of silicon oxide adjacent to the conducting layer 981 and oxide layer 982.

The layout method of the fifth embodiment, increases the AA' region resistances and decreases parasitic BJT turning on efficiency, making it possible for ESD current to go through the BB' region under MM ESD zapping. Thus, the MM ESD current bypasses bigger areas and has a higher MM ESD level than the device structures of prior arts. Conversely, the HBM ESD level will not decrease as STI is inserted between the gate and drain contact at the AA' region. Moreover, the proposed layout method can also be applied to the PMOS to improve ESD robustness.

Sixth Embodiment

Figure 10A:
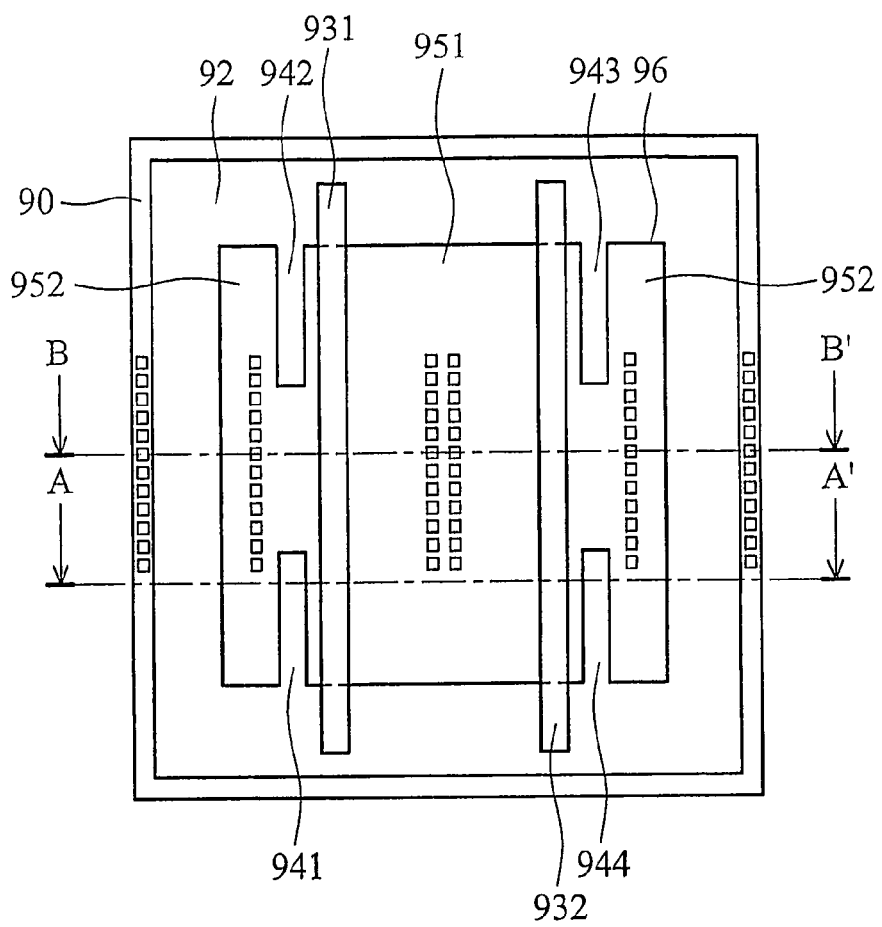
FIGS. 10A and 10B are top and sectional views along a line AA' of an ESD protection device according to a sixth embodiment of the invention.
Figure 10B:
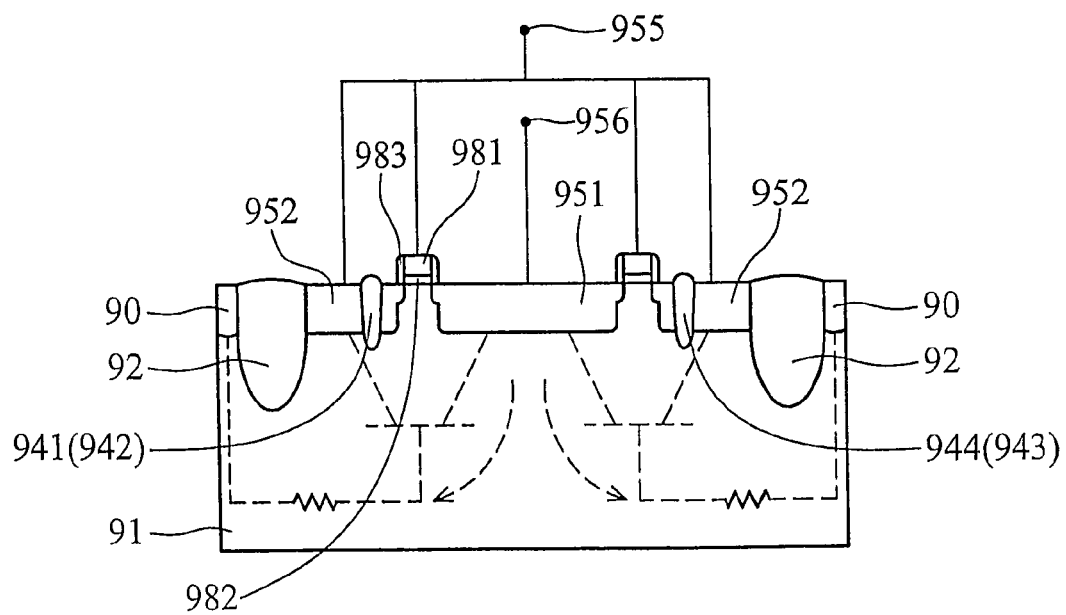

FIGS. 10A and 10B are top and sectional views along a line AA' of an ESD protection device according to a sixth embodiment of the invention. With comparison to the ESD protection device shown in FIGS. 9A and 9B, it is noted that the STI 941~944 protrudes into the second/third doping (source)

region 952. The ESD protection devices in FIGS. 9A and 9B, and 10A and 10B have equal ESD performance.

Seventh Embodiment

Figure 11A:
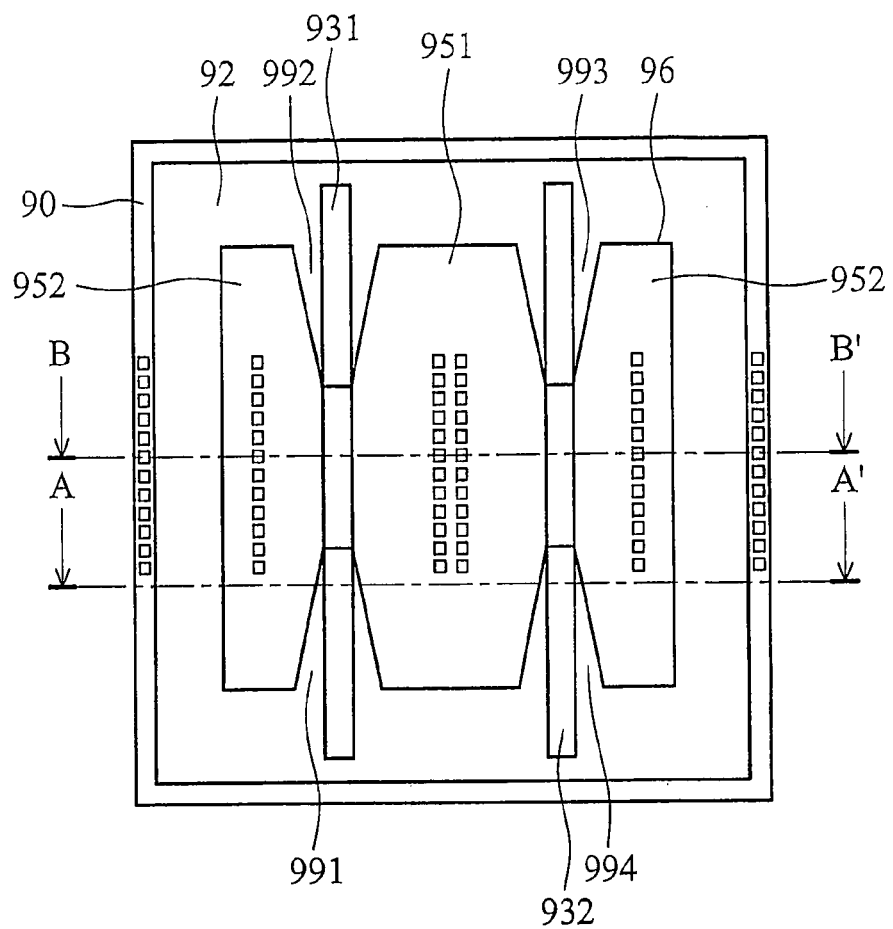
FIGS. 11A and 11B are top and sectional views along a line AA' of an ESD protection device according to a seventh embodiment of the invention.
Figure 11B:
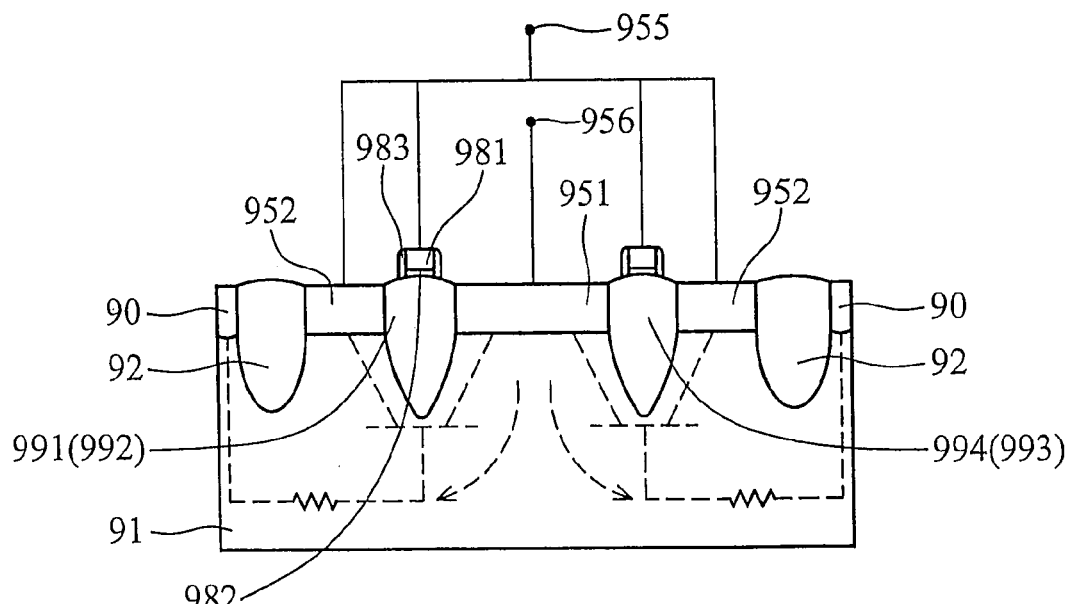

FIGS. 11A and 11B are top and sectional views along a line AA' of an ESD protection device according to a seventh embodiment of the invention. For the sake of clarity, the same elements in FIGS. 11A and 11B, and 9A and 9B refer to the same symbols. The ESD protection device includes a P silicon substrate 91, STI (shallow trench isolation) 92, a P guard ring 90 enclosing the STI 92, first gate 931 and second gate 932, and N type first doping (drain) region 951 and second doping (source) region 952. The STI 92 is on the substrate 91 and encloses an active region 96. The gates 931 and 932 have two ends overlapping the STI 92 to stretch over the active region 96, and are coupled to ground or a pre-driver. The first doping (drain) region 951 and second/third doping (source) region 952 are disposed in between and on outer sides of the first gate 931 and second gate 932, and coupled to second node 956 and first node 955, respectively. More specifically, the first node 955 is ground while the second node 956 is a pad. The STI 991-994 has portions under the first gate 931 and second gate 932 and near each end of the first gate 931 and second gate 932 protruding into both the first doping (drain) region 951 and second/third doping (source) region 952. Each of the first gate 931 and second gate 932 includes a conducting layer 981 made of polysilicon, an oxide layer 982 made of silicon oxide under the conducting layer 981 and spacers 983 made of silicon oxide adjacent to the conducting layer 981 and oxide layer 982.

The layout method of the seventh embodiment, increases the AA' region resistances and decreases parasitic BJT turning on efficiency, making it possible for ESD current to go through the BB' region under MM ESD zapping. Thus, the MM ESD current bypasses bigger areas and has a higher MM ESD level than the device structures of prior arts. Conversely, the HBM ESD level will not decrease as STI is inserted between the gate and drain contact or below the gate at the AA' region.

Eighth Embodiment

Figure 12A:
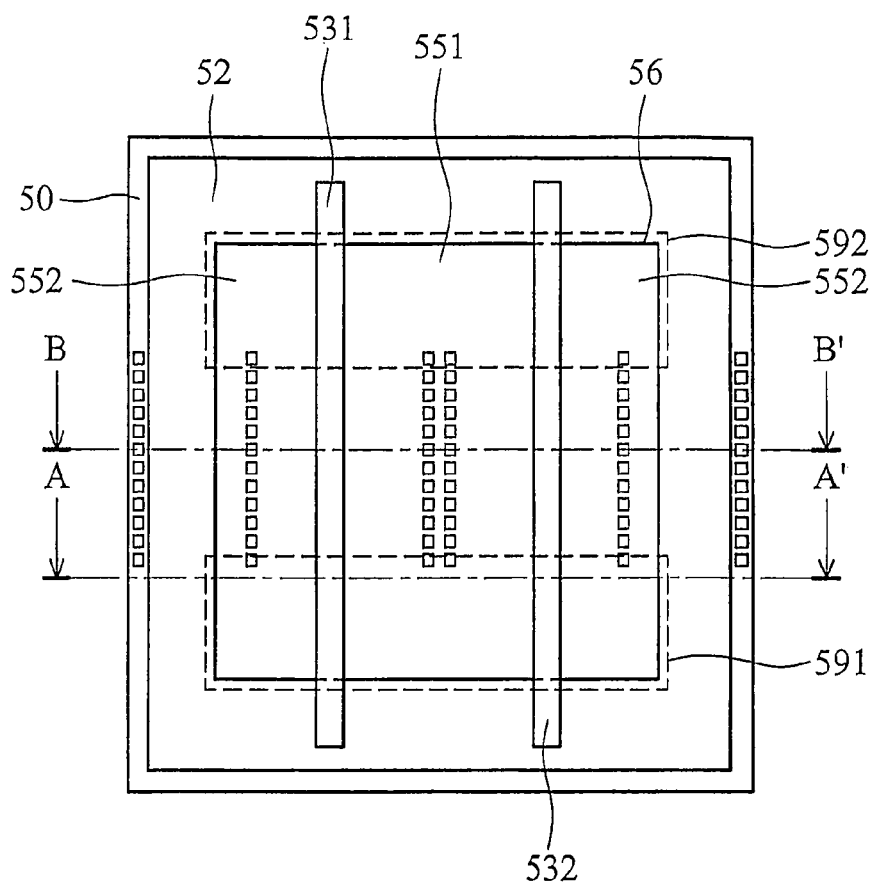
FIGS. 12A and 12B are top and sectional views along a line AA' of an ESD protection device according to an eighth embodiment of the invention.
Figure 12B:
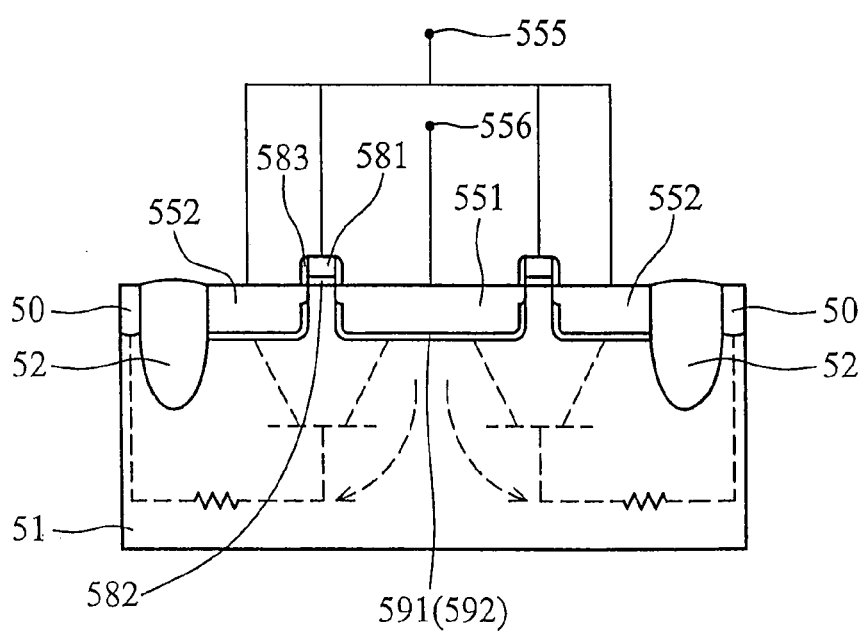

FIGS. 12A and 12B are top and sectional views along a line AA' of an ESD protection device according to an eighth embodiment of the invention. For the sake of clarity, the same elements in FIGS. 12A and 12B, and 5A and 5B refer to the same symbols. The ESD protection device includes a P silicon substrate 51, STI 52, a P guard ring 50 enclosing the STI 52, first gate 531 and second gate 532, N type first doping (drain) region 551 and second doping (source) region 552, and third/fourth doping (ESD implantation) regions 591 and 592. The STI 52 is on the substrate 51 and encloses an active region 56. The first gate 531 and second gate 532 have two ends overlapping the STI 52 to stretch over the active region 56, and are coupled to ground or a pre-driver. The first doping (drain) region 551 and second/fifth doping (source) region 552 are disposed in between and on outer sides of the first gate 531 and second gate 532, and coupled to a second node 556 and first node 555, respectively. More specifically, the first node 555 is ground while the second node 556 is a pad. The third doping (ESD implantation) regions 591 and 592 are N type lightly doped regions disposed under the first doping (drain) region 551 and second/fifth doping (source) region 552, and near each end of the first gate 531 and second gate 532. The doping concentrations of the third doping (ESD implantation) regions 591 and 592 are lower than those of the first doping (drain) region 551 and second/fifth doping (source) region 552. Each of the first gate 531 and second gate 532 includes a conducting layer 581 made of polysilicon, an oxide layer 582 made of silicon oxide under the conducting layer 581 and spacers 583 made of silicon oxide adjacent to the conducting layer 581 and oxide layer 582.

In the eighth embodiment, the junction covered by the proposed ESD implantation has an increased junction breakdown voltage, because it has a lighter doping concentration across the p-n junction. The BB' region without covering the ESD implantation, however, has the original junction breakdown voltage, which is lower than the junction breakdown of the ESD implantation region. During the ESD stress, the junction of the BB' region with the lowest junction breakdown voltage will be broken first to discharge the ESD current. As previously mentioned, the AA' region provides a larger bypass area and path for ESD current and has a high MM ESD level. On the other hand, the HBM ESD level will not decrease as the ESD implanted between the gate and drain contact at the AA' region. This can also be applied to the PMOS to improve its ESD robustness.

Ninth Embodiment

Figure 13A:
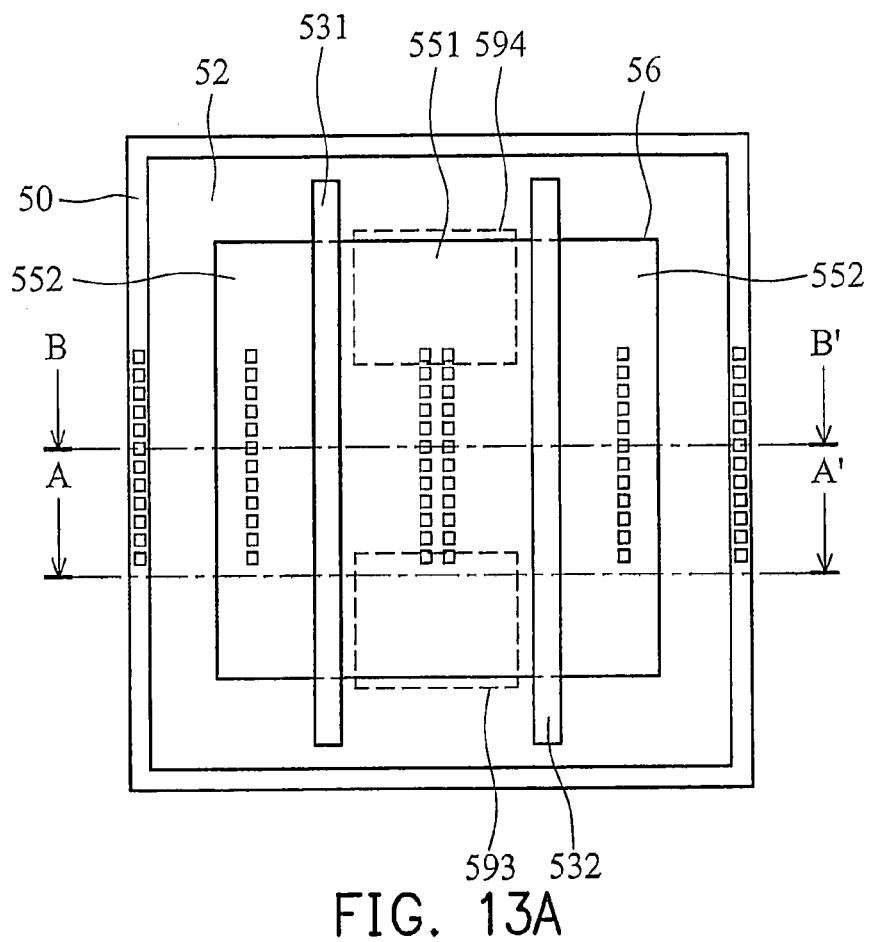
FIGS. 13A and 13B are top and sectional views along a line AA' of an ESD protection device according to a ninth embodiment of the invention.
Figure 13B:
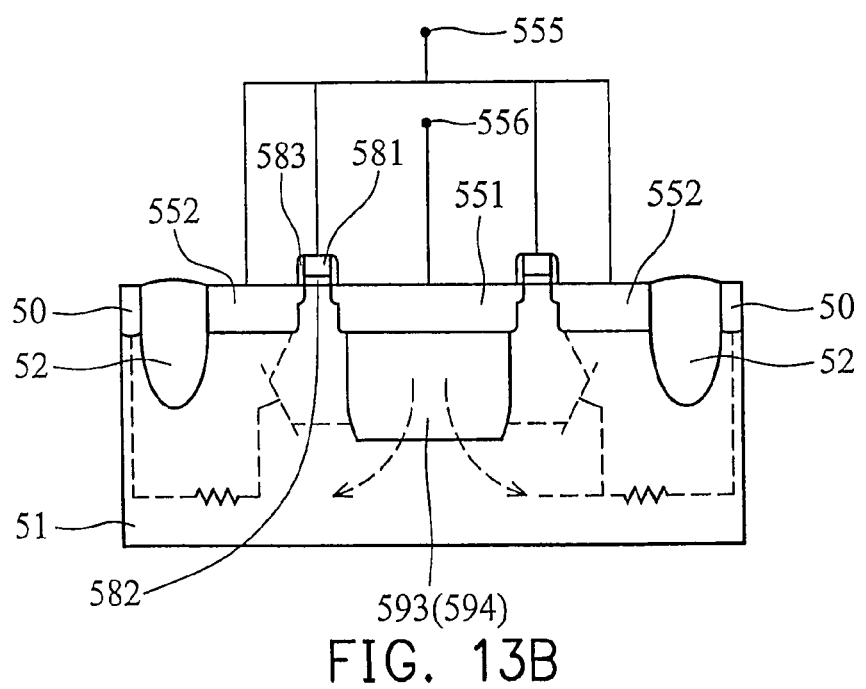

FIGS. 13A and 13B are top and sectional views along a line AA' of an ESD protection device according to an eighth embodiment of the invention. For the sake of clarity, the same elements in FIGS. 13A and 13B, and 5A and 5B refer to the same symbols. The ESD protection device includes a P silicon substrate 51, STI 52, a P type fourth doping region (guard ring) 50 enclosing the STI 52, first gate 531 and second gate 532, N type first doping (drain) region 551 and second doping (source) region 552, and N type first doping region well 593 and second doping region well 594. The STI 52 is on the substrate 51 and encloses an active region 56. The first gate 531 and second gate 532 have two ends overlapping the STI 52 to stretch over the active region 56, and are coupled to ground or a pre-driver. The first doping (drain) region 551 and second doping (source) region 552 are disposed in between and on outer sides of the first gate 531 and second gate 532, and coupled to a second node 556 and first node 555, respectively. More specifically, the first node 555 is ground while the second node 556 is a pad. The N type first well 593 and second well 594 are disposed under the first doping (drain) region 551, and near first and second ends of the first gate 531 and second gate 532. Each of the first gate 531 and second gate 532 includes a conducting layer 581 made of polysilicon, an oxide layer 582 made of silicon oxide under the conducting layer 581 and spacers 583 made of silicon oxide adjacent to the conducting layer 581 and oxide layer 582.

In the ninth embodiment, the MOSFET at the AA' region has a lighter doping concentration (N well) than that of the original (N+) drain junction. Therefore, the junction covered by the proposed N well has an increased junction breakdown voltage, because it has a lighter doping concentration across the p-n junction. However, the BB' region without inserting N well has the original junction breakdown voltage, which is lower than the junction breakdown of the AA' region with N well inserted. During the ESD stress, the junction the BB' region with the lowest junction breakdown voltage will be broken first to discharge the ESD current. As previously mentioned, the AA' region provides a larger bypass area and path for ESD current and has a higher MM ESD level.

Tenth Embodiment

Figure 14A:
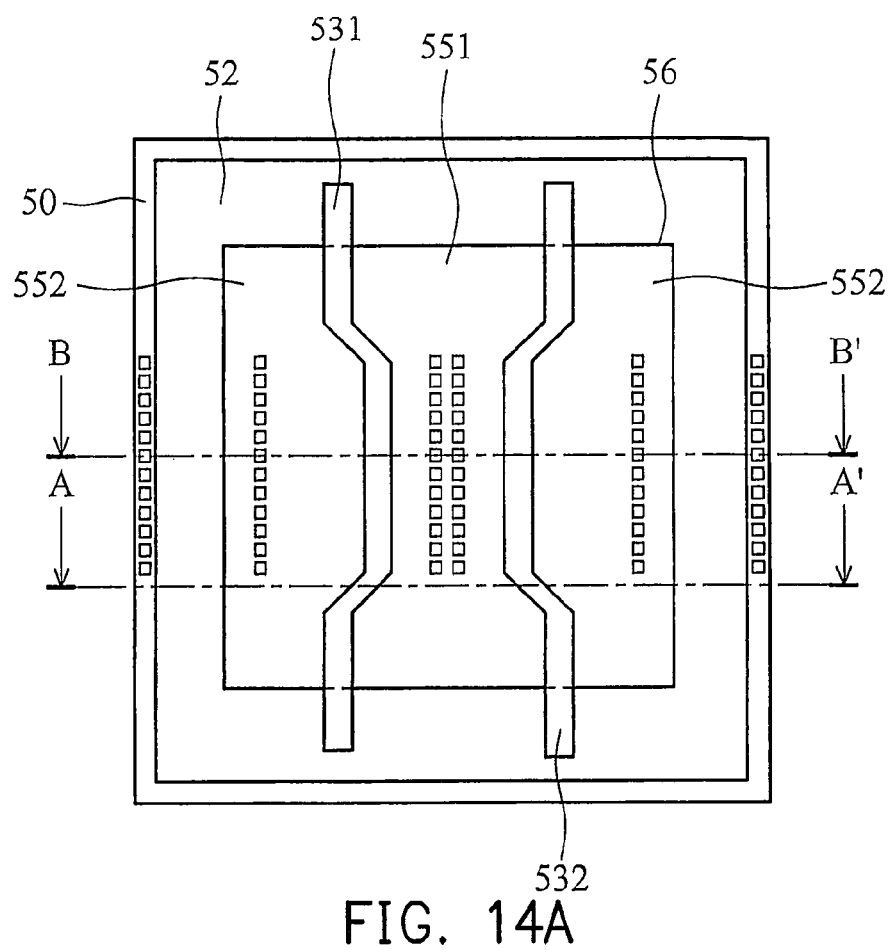
FIGS. 14A and 14B are top and sectional views along a line AA' of an ESD protection device according to a tenth embodiment of the invention.
Figure 14B:
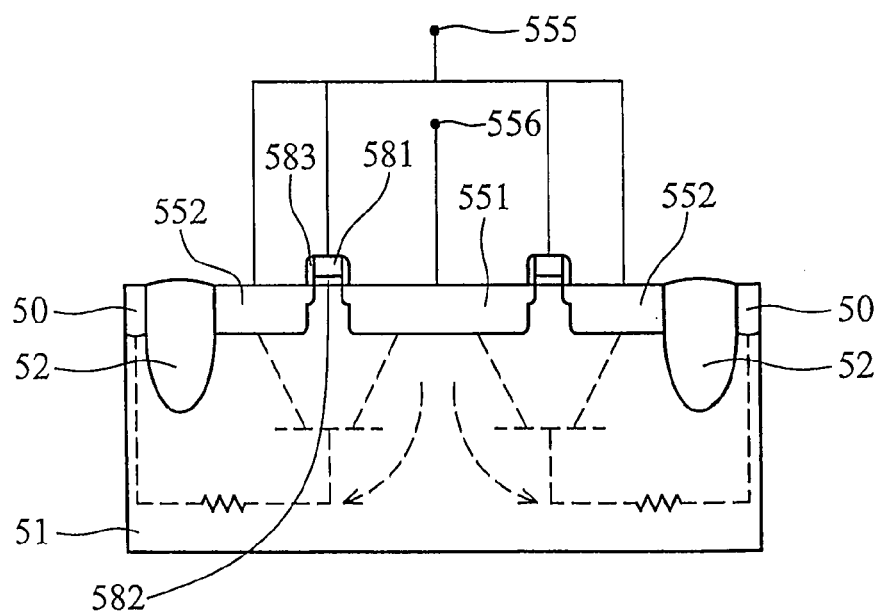

FIGS. 14A and 14B are top and sectional views along a line AA' of an ESD protection device according to an tenth embodiment of the invention. For the sake of clarity, the same elements in FIGS. 14A and 14B, and 5A and 5B refer to the same symbols. The ESD protection device includes a P silicon substrate 51, STI 52, a P guard ring 50 enclosing the STI 52, first gate 531 and second gate 532, and N type first doping (drain) region 551 and second doping (source) region 552. The STI 52 is on the substrate 51 and encloses an active region 56. The first gate 531 and second gate 532 have two ends overlapping the STI 52 to stretch over the active region 56, and are coupled to ground or a pre-driver. The first doping (drain) region 551 and second/third doping (source) region 552 are disposed in between and on outer sides of the first gates 531 and second gate 532, and coupled to a second node 556 and first node 555, respectively. More specifically, the first node 555 is ground while the second node 556 is a pad. The first gate 531 and second gate 532 are bent at an angle so that their center portions protrude into the first doping (drain) region 551. Thus, the widths of the first doping (drain) region 551 near the center portions of the first gate 531 and second gate 532 are smaller than those near each end of the first gate 531 and second gate 532. Each of the first gate 531 and second gate 532 includes a conducting layer 581 made of polysilicon, an oxide layer 582 made of silicon oxide under the conducting layer 581 and spacers 583 made of silicon oxide adjacent to the conducting layer 581 and oxide layer 582.

In the tenth embodiment, at the AA' region, the drain contact to the poly edge space (DGS) is larger than the space at the BB' region, therefore the equivalent base spacing of the parasitic BJT device at the AA' region can be increased. With a wider base spacing, the BJT will have a lower turn-on speed and lower current gain. In this structure, the turn-on efficiency of the parasitic BJT at the AA' region decreases. ESD current will be discharged through the parasitic BJT at the BB' region under MM ESD zapping. Thus, the MM ESD current effectively bypasses bigger areas and has a higher MM ESD level than the device structures of the prior arts. Conversely, the HBM ESD level will not decrease and can also be applied to the PMOS to improve its ESD robustness.

In all the previously described embodiments, the layouts are also suitable for PMOS although NMOS is used as an example. They are also suitable for stacked NMOS or PMOS in mixed voltage I/O circuits.

In conclusion, novel ESD protection device structures are proposed in this invention for application under MM ESD stress in sub-quarter-micron CMOS technology. The ESD discharging current path in the NMOS or PMOS device structure is changed by the proposed new structures, therefore the MM ESD level of the NMOS and PMOS can be significantly improved. In this invention, 6 kinds of new structures protect the lateral BJT at the AA' region from current crowding and to balance the turned on efficiency of the lateral BJT at the BB' region. The MM ESD current bypasses through the lateral BJT at the BB' region instead of the AA' region, and has a larger bypass area than the prior structures. The current crowding problem can be solved successfully, and have a higher MM ESD robustness. Moreover, these novel devices will not degrade the HBM ESD level and are widely used in ESD protection circuits.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. An ESD protection device comprising:
   a substrate;
   an isolation region on the substrate, enclosing an active region;
   a first gate coupled to a first node, wherein the first gate has first and second ends, first and second oblique portions and a center portion, wherein the first and second ends overlap the isolation region to stretch over the active region; and
   a first and second doping regions on the first and a second sides of the first gate, and coupled to a second and the first nodes respectively; and
   wherein the center portion of the first gate protrudes into the first doping region and is parallel to the first and second ends of the first gate,
   wherein the first end and the center portion of the first gate are connected by the first oblique portion of the first gate, and the second end and the center portion of the first gate are connected by the second oblique portion of the first gate.

2. The ESD protection device as claimed in claim 1, wherein the isolation region is a shallow trench isolation.

3. The ESD protection device as claimed in claim 1, wherein the first node is ground while the second node is a pad.

4. The ESD protection device as claimed in claim 1 further comprising:
   a second gate coupled to the first node, wherein the second gate has first and second ends, first and second oblique portions and a center portion, wherein the first and second ends of the second gate overlap the isolation region to stretch over the active region, and the first doping region is on a first side of the second gate; and
   a third doping region on a second side of the second gate, coupled to the first node;
   wherein the center portion of the second gate protrudes into the first doping region and is parallel to the first and second ends of the second gate,
   wherein the first end and the center portion of the second gate are connected by the first oblique portion of the second gate, and the second end and the center portion of the second gate are connected by the second oblique portion of the second gate.

5. The ESD protection device as claimed in claim 4, wherein each of the first and second gate comprises:
   a conducting layer;
   a gate oxide layer under the conducting layer; and
   a first and second spacer respectively adjacent to two sides of the conducting layer and gate oxide layer.

6. The ESD protection device as claimed in claim 5, wherein the conducting layer is a polysilicon layer while the gate oxide layer, and the first and second spacer are silicon oxide layers.

7. The ESD protection device as claimed in claim 1 further comprising a fourth doping region enclosing the isolation region.

8. The ESD protection device as claimed in claim 7, wherein the substrate is a P substrate, the first, second and third doping region are N doping regions, and the fourth doping region is a P doping region.

* * * * *